United States Patent
Zen

(10) Patent No.: US 7,724,033 B1
(45) Date of Patent: May 25, 2010

(54) INPUT/OUTPUT PROGRAMMABLE ROUTING IN A PROGRAMMABLE LOGIC DEVICE

(75) Inventor: Hidemori Zen, Kanagawa (JP)

(73) Assignee: Xilinx, Inc., San Jose, CA (US)

( * ) Notice: Subject to any disclaimer, the term of this patent is extended or adjusted under 35 U.S.C. 154(b) by 9 days.

(21) Appl. No.: 12/047,181

(22) Filed: Mar. 12, 2008

(51) Int. Cl.
*H03K 19/177* (2006.01)

(52) U.S. Cl. .......................................... 326/41; 326/39

(58) Field of Classification Search ............. 326/37–47; 370/359; 710/5, 14, 36, 51, 52, 65
See application file for complete search history.

(56) References Cited

U.S. PATENT DOCUMENTS 5,764,080 A * 6/1998 Huang et al. ................... 326/41
7,085,870 B2 * 8/2006 Do .............................. 710/302
2006/0182150 A1 * 8/2006 Ramsdale .................... 370/517

\* cited by examiner

*Primary Examiner*—James H. Cho
*Assistant Examiner*—Christopher Lo
(74) *Attorney, Agent, or Firm*—Kevin T. Cuenot

(57) ABSTRACT

A programmable logic device can include a logic core in low power mode, a source input/output (I/O) bank including at least one source I/O pin, wherein the source I/O bank operates in normal operating mode, and a destination I/O bank including at least one destination I/O pin, wherein the destination I/O bank operates in normal operating mode. The programmable logic device also can include a bypass routing bus coupled to the source I/O bank and the destination I/O bank, wherein the bypass routing bus detects an I/O signal from the source I/O pin, responsively generates a bypass signal that is provided to the destination I/O bank and, responsive to the bypass signal, generates an output bypass signal on the destination I/O pin.

13 Claims, 5 Drawing Sheets

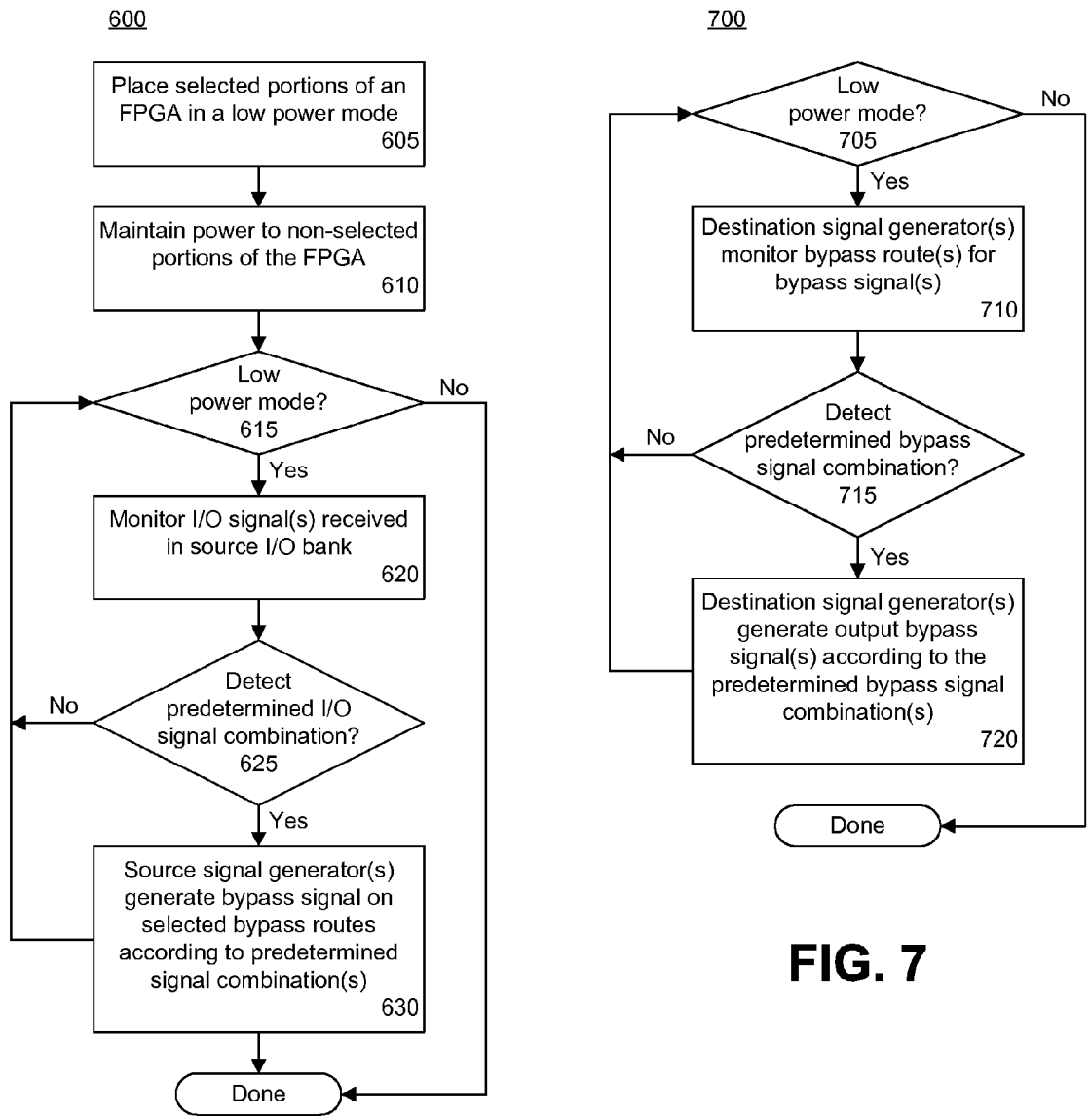

INPUT/OUTPUT PROGRAMMABLE ROUTING IN A PROGRAMMABLE LOGIC DEVICE

FIELD OF THE INVENTION

The embodiments disclosed herein relate to programmable logic devices (PLDs). More particularly, the embodiments relate to input/output programmable routing in low power modes.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as devices that are only partially programmable. For example, one type of PLD includes a combination of hard-coded transistor logic and a programmable switch fabric that programmably interconnects the hard-coded transistor logic.

PLDs have become commonplace within a variety of different types of systems. Often, the PLD is incorporated into a system that includes a primary processor, e.g., a microprocessor, as well as one or more peripheral devices. The PLD, for example, may be disposed within the system as an interface linking the peripheral devices with the primary processor. When not in use, the PLD may be powered down or placed in a low power mode. When in a low power mode, signals passed into the PLD, e.g., from a peripheral device, the processor, or another source, are not passed back out to other devices. This means that when placed in low power mode, the PLD no longer functions as an interface. The PLD effectively becomes an open circuit in that signals are not passed in, out, or through the device In illustration, consider the case where signals from a peripheral device are coupled to the PLD. The PLD functions as an interface between the peripheral device and another processor. Signals from the peripheral device that are coupled to the PLD may also be used to "wake-up" the processor from a low power mode. When the processor is in a low power mode, power consumption can be further reduced if the PLD is also placed in a low power mode. When placed in a low power mode, however, the PLD cannot pass the signals needed to "wake-up" the processor. Accordingly, alternate channels external to the PLD must be provided to allow such signals to propagate to the processor when the PLD is in a low power mode.

In other examples, it may be desirable to place the PLD in a low power mode and, under certain circumstances, provide a signal to another device, e.g., a processor. While the PLD is placed in a low power mode, the processor may or may not be operating in a low power mode. In any case, the signals to be provided to the processor would not be passed through the PLD. Further, as noted, an alternate channel that is external to the PLD would have to be provided to couple the peripheral device with the processor when the PLD is in low power mode.

SUMMARY OF THE INVENTION

The embodiments disclosed herein relate to input/output (I/O) programmable routing within a programmable logic device (PLD) when in a low power mode. One embodiment of the present invention can include a PLD. The PLD can include a logic core in low power mode, a source I/O bank including at least one source I/O pin, wherein the source I/O bank operates in normal operating mode, and a destination I/O bank including at least one destination I/O pin, wherein the destination I/O bank operates in normal operating mode. The PLD also can include a bypass routing bus coupled to the source I/O bank and the destination I/O bank. The bypass routing bus can detect an I/O signal from the source I/O pin, responsively generate a bypass signal that is provided to the destination I/O bank and, responsive to the bypass signal, generate an output bypass signal on the destination I/O pin.

The bypass routing bus can include one or more bypass routes that circumnavigate the logic core and couple the source I/O bank with the destination I/O bank. The bypass route(s) may be external to the logic core. The bypass routing bus can be selectively coupled to the source I/O pin and the destination I/O pin. The bypass route, or each bypass route, can include one or more pull up devices.

In another embodiment, the bypass routing bus can include a plurality of bypass routes and a plurality of source bypass signal generators. An output of each source bypass signal generator can be coupled to one bypass route. Each source bypass signal generator can receive at least one I/O signal from a source I/O pin of the source I/O bank.

In another embodiment, the bypass routing bus can include a plurality of bypass routes and a plurality of destination bypass signal generators, wherein each of the plurality of bypass routes is coupled to an input of one or more destination bypass signal generators. An output of each destination bypass signal generator can be coupled to a destination I/O pin in the destination I/O bank. Each destination bypass signal generator can selectively generate an output bypass signal to the destination I/O pin coupled to that destination bypass signal generator. Each destination bypass signal generator further can generate an output bypass signal according to bypass signals detected on each bypass route coupled to the destination bypass signal generator.

In another embodiment, the bypass routing bus can include a plurality of source bypass signal generators, wherein each source bypass signal generator selectively generates a bypass signal according to at least one I/O signal received from the source I/O pin of the source I/O bank. The bypass routing bus further can include a plurality of bypass routes circumnavigating the logic core, wherein each bypass route is coupled to an output of one source bypass signal generator.

Additionally, the bypass routing bus can include a plurality of destination bypass signal generators, wherein an input of each destination bypass signal generator is coupled to at least one of the plurality of bypass routes. Further, each destination bypass signal generator can selectively generate an output bypass signal according to bypass signals detected upon bypass routes coupled to the destination bypass signal generator. Each destination bypass signal generator can be coupled to a different I/O pin within the destination I/O bank.

Another embodiment of the present invention can include a PLD including a logic core in low power mode and an I/O bank including at least one source I/O pin and at least one destination I/O pin. The I/O bank can operate in normal operating mode. The PLD further can include a bypass routing bus coupled to the I/O bank, wherein the bypass routing bus detects an I/O signal from the source I/O pin, responsively generates a bypass signal and, responsive to the bypass signal, generates an output bypass signal on the destination I/O pin.

Another embodiment of the present invention can include a method of routing signals within a PLD. The method can include maintaining power within a source I/O bank and a destination I/O bank while a logic core of the PLD is placed in low power mode, receiving at least one I/O signal within the source I/O bank, and responsive to receiving the I/O signal, generating a bypass signal on at least one bypass route external to the logic core of the PLD. The method also can include detecting the bypass signal on the bypass route and generating an output bypass signal on an I/O pin of the destination I/O bank.

The method can include selecting a bypass route from a plurality of bypass routes upon which the bypass signal is generated. Accordingly, generating the output bypass signal can include selecting the destination I/O pin of the destination I/O bank according to which of the plurality of bypass routes upon which a bypass signal is detected.

The method also can include, responsive to entering low power mode, for each I/O signal, disabling a signal path that enters the logic core of the PLD. The bypass route can be selected to traverse a signal path that circumnavigates the logic core of the PLD. In another embodiment, the method can include, responsive to entering low power mode, switching each I/O signal from a signal path that enters a core of the PLD to an alternate signal path controlling signal generation on the bypass route.

Each I/O signal can be selectively allowed to propagate along a signal path that couples to the logic core of the PLD or to propagate along a signal path that controls generation of the bypass signal on the bypass route according to whether low power mode is initiated.

BRIEF DESCRIPTION OF THE DRAWINGS

FIG. 6 is a first flow chart illustrating a method of routing signals within an FPGA in accordance with another embodiment of the present invention.

FIG. 7 is a second flow chart illustrating a method of routing signals within an FPGA in accordance with another embodiment of the present invention.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to input/output (I/O) routing programmability in a programmable logic device (PLD) when in low power mode. In accordance with the embodiments disclosed herein, a PLD can be placed in a low power mode. While in the low power mode, signals may be selectively propagated through the PLD. More particularly, responsive to receiving one or more I/O signals in a source I/O bank, a bypass signal can be directly propagated to a destination I/O bank. An output bypass signal can be output from one or more selected I/O pins of the destination I/O bank.

In accordance with the embodiments disclosed herein, a bypass routing bus can be included in the PLD. The bypass routing bus allows signals to propagate directly from a source I/O bank to a destination I/O bank via one or more bypass routes when the PLD is in low power mode. Signals can be selectively propagated, or generated, down the bypass routes according to various combinations of one or more I/O signals received within the source I/O bank. One or more output bypass signals can be output from selected I/O pins of the destination I/O bank responsive to detecting bypass signals on selected bypass routes.

Figure 1:
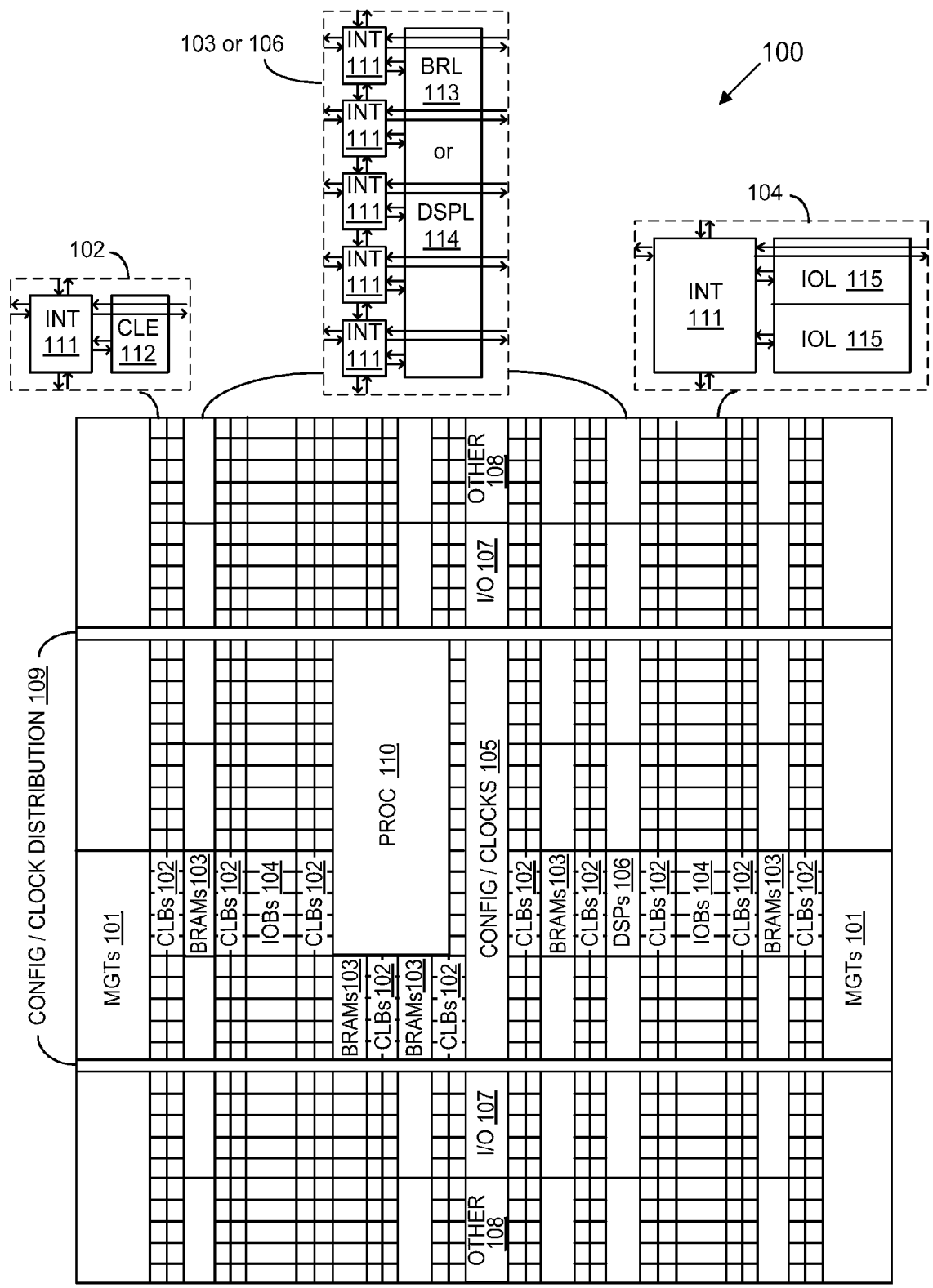
FIG. 1 is a block diagram illustrating an exemplary architecture for a field programmable gate array (FPGA) type of programmable logic device.

FIG. 1 illustrates an FPGA architecture 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output (I/O) ports 107 (e.g., configuration ports and clock ports), and other programmable logic 108 such as digital clock managers, analog-to-digital converters, system monitoring logic, and so forth. Some FPGAs also include dedicated processor blocks (PROC) 110.

In some FPGAs, each programmable tile includes a programmable interconnect element (INT) 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element (CLE) 112 that can be programmed to implement user logic plus a single programmable interconnect element 111. A BRAM 103 can include a BRAM logic element (BRL) 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL) 114 in addition to an appropriate number of programmable interconnect elements 111. An IOB 104 can include, for example, two instances of an input/output logic element (IOL) 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks or dedicated logic. For example, the processor block 110 shown in FIG. 1 spans several columns of CLBs and BRAMs.

FIG. 1 is intended to illustrate an exemplary FPGA architecture. The number of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be, for example, a Virtex-4™ FPGA from Xilinx, Inc. of San Jose, Calif. (Xilinx and Virtex are trademarks of Xilinx, Inc. in the United States, other countries, or both.)

An FPGA is used throughout this specification, by way of example, to better illustrate the various embodiments of the present invention. It should be appreciated, however, that the embodiments disclosed herein can be applied to other types of PLDs. The embodiments described herein, for example, can be applied to any PLD that has the ability to place selected portions in a standby, or low power, mode.

In the present specification, the same reference characters are used to refer to terminals, signal lines, wires, and their corresponding signals. In this regard, the terms "signal," "wire," "connection," "terminal," and "pin" may be used interchangeably within the present specification from time to time.

Figure 2:
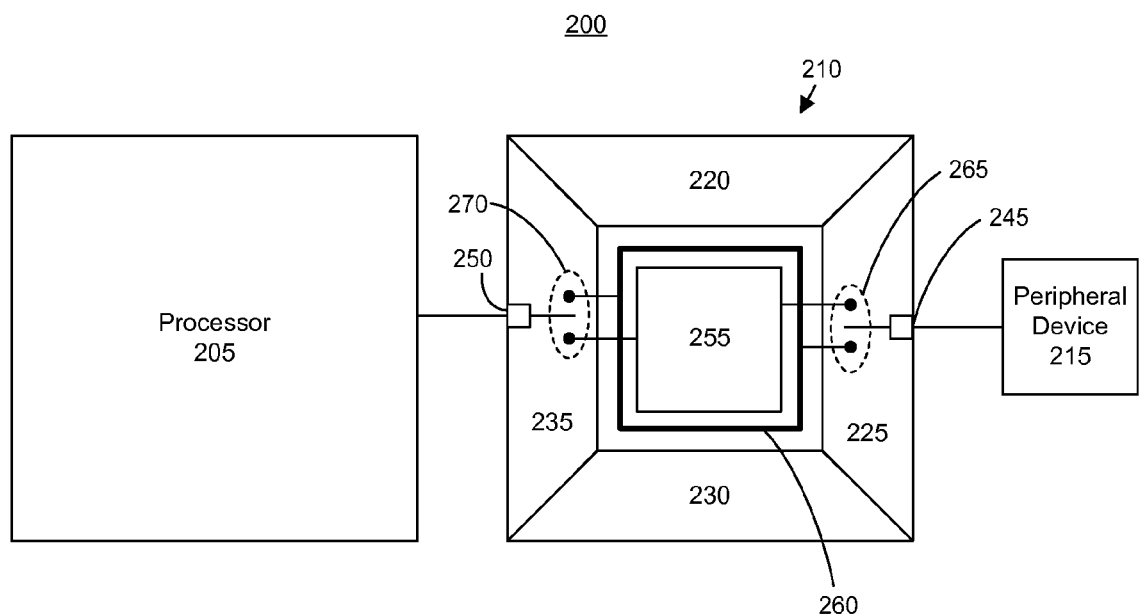
FIG. 2 is a block diagram illustrating an exemplary system in accordance with one embodiment of the present invention.

FIG. 2 is a block diagram illustrating an exemplary system 200 in accordance with one embodiment of the present invention. The system 200 can include a processor 205, an FPGA 210, and at least one peripheral device 215. As shown, the FPGA 210 is disposed between the peripheral device 215 and processor 205. For purposes of illustration, it can be assumed that a signal from peripheral device 215 is to be provided to processor 205, or is to cause the FPGA 210 to provide a signal to processor 205, when the FPGA 210 is in a low power mode.

The FPGA 210 can include a plurality of I/O banks 220, 225, 230, and 235. An "I/O bank," as used herein, can refer to a physical collection or grouping of I/O devices, e.g., IOBs and/or I/O pins, commonly found within an FPGA or other PLD. It should be appreciated that each IOB can be coupled to an I/O pin of the PLD. As noted, the I/O pin need not be located in the same physical area of the PLD as the IOB. For purposes of discussion, however, the terms "input/output block," "IOB," "input/output pin," and "I/O pin" may be used interchangeably in that each circuit element may be the source of a signal or the destination for a signal. For example, a signal may be received via an I/O pin and corresponding IOB and provided to another IOB and corresponding I/O pin of the FPGA 210.

Accordingly, each I/O bank can include a plurality of I/O pins such as I/O pins 245 and 250. The FPGA 210 further can include logic core 255. The logic core 255 can refer to the programmable fabric of the FPGA 210. Structures such as CLBs, BRAMs, embedded processors, and other programmable circuit structures, excluding the I/O banks 220-235, and a bypass routing bus 260, can be considered part of the logic core 255. For example, a user design, when loaded into FPGA 210, can be implemented within the logic core 255, with the exception of various I/O functions as noted and the bypass routing bus 260 to be described herein in greater detail.

In one embodiment, different portions of the FPGA 210 can be selectively powered down, or placed in low power mode. For example, the logic core 255 may be placed in low power mode, while one or more selected I/O banks remain powered or active. The determination of which I/O banks and I/O pins within such banks that will remain active can be preprogrammed into the FPGA 210 by the configuration bitstream. Any I/O banks not selected to remain active, or in a normal operation mode, also can be placed in low power mode. In illustration, I/O banks 225 and 235 can remain powered on, e.g., in a normal operating mode. I/O banks 220 and 230, however, can be placed in low power mode with logic core 255.

It should be appreciated that when a portion of the FPGA 210 is in "low power mode," power may be completely turned off to that portion of the FPGA 210. In other cases, when a portion of the FPGA 210 is in "low power mode," the power to that portion can be reduced to such a degree that the portion is inoperable and/or does not pass signals, e.g., is an open circuit.

The bypass routing bus 260 can communicatively link one or more I/O pins of I/O banks that have been selected to remain active during low power mode. The bypass routing bus 260 can be formed of one or more conductive signal paths, e.g., wires, that circumnavigate the logic core 255 of FPGA 210 as shown. In this example, one or more pins of I/O bank 225, e.g., I/O pin 245, can be communicatively linked via the bypass routing bus 260 with one or more I/O pins of I/O bank 235, e.g., I/O pin 250. It should be appreciated that while only two I/O pins are depicted as remaining active, more I/O pins of I/O banks 225 and 235 may remain active. Further, more I/O banks may remain active if so desired.

In the example pictured in FIG. 2, an I/O signal is to be received from the peripheral device 215 via I/O pin 245 in I/O bank 225 while the FPGA 210 is in low power mode. In response, a signal is to be output from I/O pin 250 within I/O bank 235 to processor 205, also while the FPGA 210 is in low power mode. Accordingly, I/O pin 245 can be referred to as a source I/O pin. Similarly, I/O bank 225 can be referred to as a source I/O bank. I/O pin 250 can be referred to as a destination I/O pin and I/O bank 235 can be referred to as a destination I/O bank.

In one embodiment, the bypass routing bus 260 can include a source switch 265 and a destination switch 270. Prior to being placed in low power mode, each of I/O pins 245 and 255 can be coupled to the logic core 255. I/O pins 245 and 250 can be selectively switched between connecting with the logic core 255 and the bypass routing bus 260 responsive to detection of the FPGA 210 entering low power mode.

I/O pin 245 can be coupled to the logic core 255 via source switch 265. I/O pin 250 can be coupled to logic core 255 via destination switch 270. Responsive to the logic core 255 being placed in low power mode, I/O pin 245 can be coupled to the bypass routing bus 260 and disconnected from the logic core 255 via source switch 265. Similarly, responsive to the logic core 255 being placed in low power mode, I/O pin 250 can be coupled to the bypass routing bus 260 and disconnected from the logic core 255 via destination switch 270. Accordingly, signals from peripheral device 215 can be propagated from I/O pin 245 to I/O pin 250, to processor 205. Upon termination of low power mode, each of I/O pins 245 and 250 can be reconnected to the logic core 255 and disconnected from the bypass routing bus 260.

In one embodiment, each of I/O pins 245 and 250 can be coupled to the bypass routing bus 260 such that a signal received at I/O pin 245 can be propagated as a bypass signal directly to I/O pin 250 via the bypass routing bus 260. In another embodiment, additional logic can be included that allows a bypass signal to be generated upon the bypass routing bus 260 responsive to receiving one or more I/O signals. In this case the I/O signal that is received is received via I/O pin 245. In any case, the bypass routing bus 260 can bypass the logic core 255 and any other portions of the FPGA 210 that are in low power mode.

In another embodiment, I/O pin 245 and/or I/O pin 250 can be coupled to both the logic core 255 and the bypass routing bus 260. When FPGA 210 is not in low power mode, I/O signals received from I/O pin 245 can be prevented from propagating down, or prevented from causing a bypass signal to be generated on, bypass routing bus 260 or a signal path to bypass routing bus 260. Responsive to being placed in low power mode, I/O signals received via I/O pin 245 can be permitted to propagate down, or be permitted to cause a bypass signal to be generated on, bypass routing bus 260. At the same time, I/O signals from I/O pin 245 can be prevented from propagating along a signal path into the logic core 255.

Figure 3:
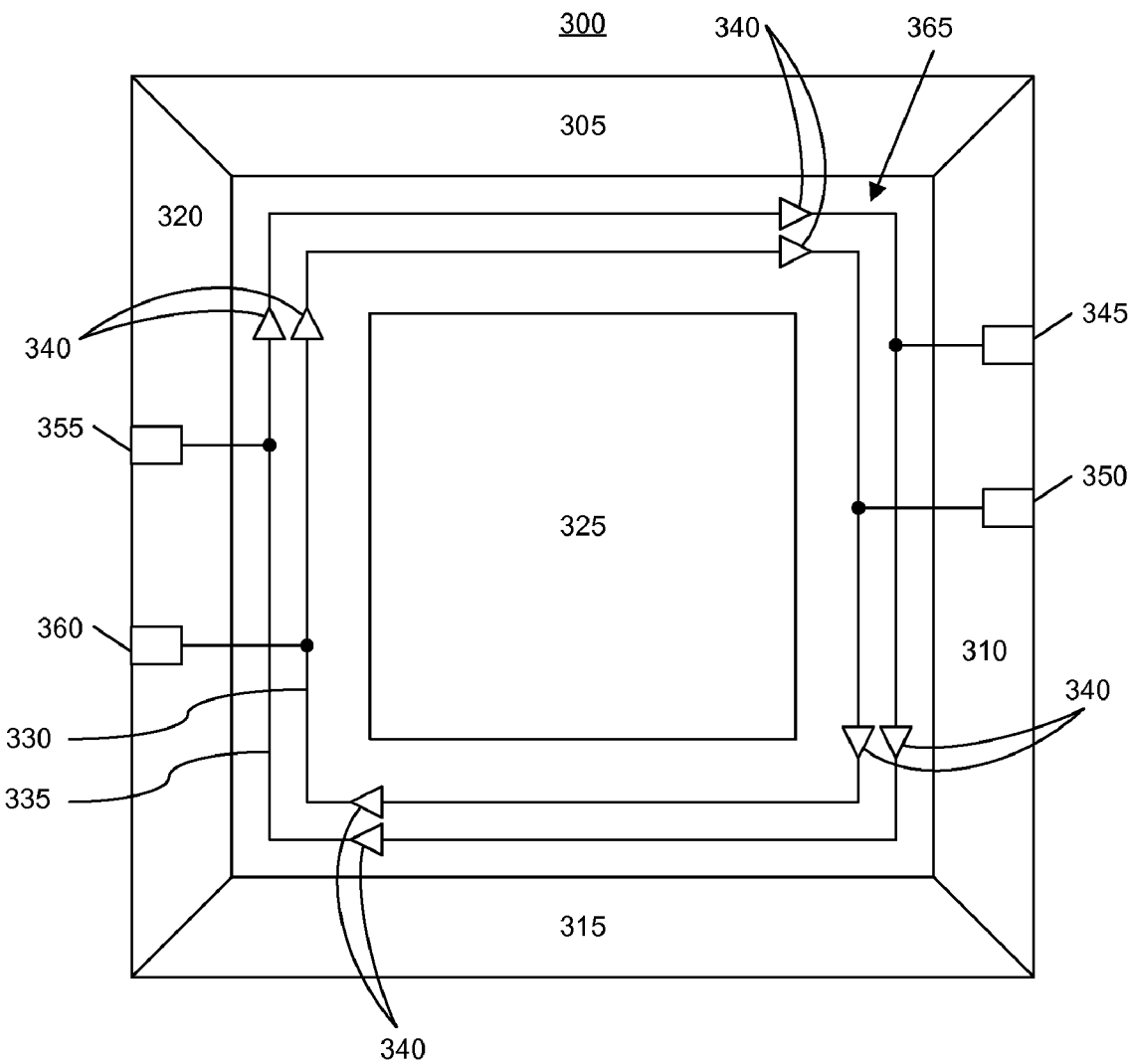
FIG. 3 is a block diagram illustrating an FPGA configured in accordance with another embodiment of the present invention.

FIG. 3 is a block diagram illustrating an FPGA 300 configured in accordance with another embodiment of the present invention. The FPGA 300 can include a plurality of I/O banks 305, 310, 315, and 320, as well as logic core 325. The FPGA further can include a bypass routing bus 365. I/O bank 310 can include I/O pins 345 and 350. I/O bank 320 can include I/O pins 355 and 360.

The bypass routing bus 365 can include one or more bypass routes 330 and 335. Each bypass route 330 and 335 can include one or more drivers 340. Each driver 340 can drive a received signal with sufficient power so that the signal, referred to as a bypass signal, propagates from a source I/O pin in a source I/O bank to a destination I/O pin in a destination I/O bank. It should be appreciated that while only a single driver may be needed for a given bypass route, depending upon the location of the source I/O pin, the source I/O bank, the destination I/O pin, and/or destination I/O bank, further drivers may be interspersed along the bypass routes as illustrated.

I/O pins located within I/O banks that remain active when the logic core 325, and potentially other I/O banks, are in low power mode can be selectively coupled one or more of the bypass routes 330 and 335. For purposes of clarity, the interconnect circuitry used to couple the I/O pins 345, 350, 355, and 360 to the bypass routing bus 365 is not shown in FIG. 3.

Consider the case where I/O bank 310 and I/O bank 320 remain powered, e.g., in a normal operating mode, while I/O banks 305, 315 and logic core 325 are placed in low power mode. For purposes of illustration, a peripheral device may be connected to I/O pin 345 and I/O pin 350 within I/O bank 310. Accordingly, I/O bank 310 can be referred to as the "source I/O bank" and each I/O pin coupled to the peripheral device, or the device that is providing signal to be monitored when the PLD is in low power mode, can be referred to as "source I/O pins." While in low power mode and under particular circumstances, an output bypass signal may be provided from each of I/O pins 355 and 360. Accordingly, I/O bank 320 can be referred to as the "destination I/O bank." I/O pins 355 and 360 can be referred to as "destination I/O pins."

When the FPGA 300 is placed in low power mode, source I/O pin 345 can be coupled to bypass route 335, while source I/O pin 350 can be coupled to bypass route 330. Similarly, destination I/O pin 355 can be coupled to bypass route 335, while destination I/O pin 360 can be coupled to bypass route 330. Accordingly, signal received at source I/O pin 345 can be propagated down bypass route 335 as a bypass signal to destination I/O pin 355. Signal received at source I/O pin 350 can be propagated down bypass route 330 as a bypass signal to destination I/O pin 360.

In another embodiment, the signals received at either one or both of source I/O pins 345 and 350 can be used to selectively generate a bypass signal on either one or both of bypass routes 330 and 335. In that case, any bypass signal generated on bypass route 330 can be propagated to destination I/O pin 355, while any bypass signal generated on bypass route 335 can be propagated to destination I/O pin 360.

As will be described herein, further circuitry can be included within the FPGA 300 which allows one or more source I/O pins to cause a signal to be generated upon one or more selected bypass routes. Additional circuitry may be included that allows signals detected on various combinations of bypass routes to cause a signal to be generated on a selected one, or more, destination I/O pin(s).

Figure 4:
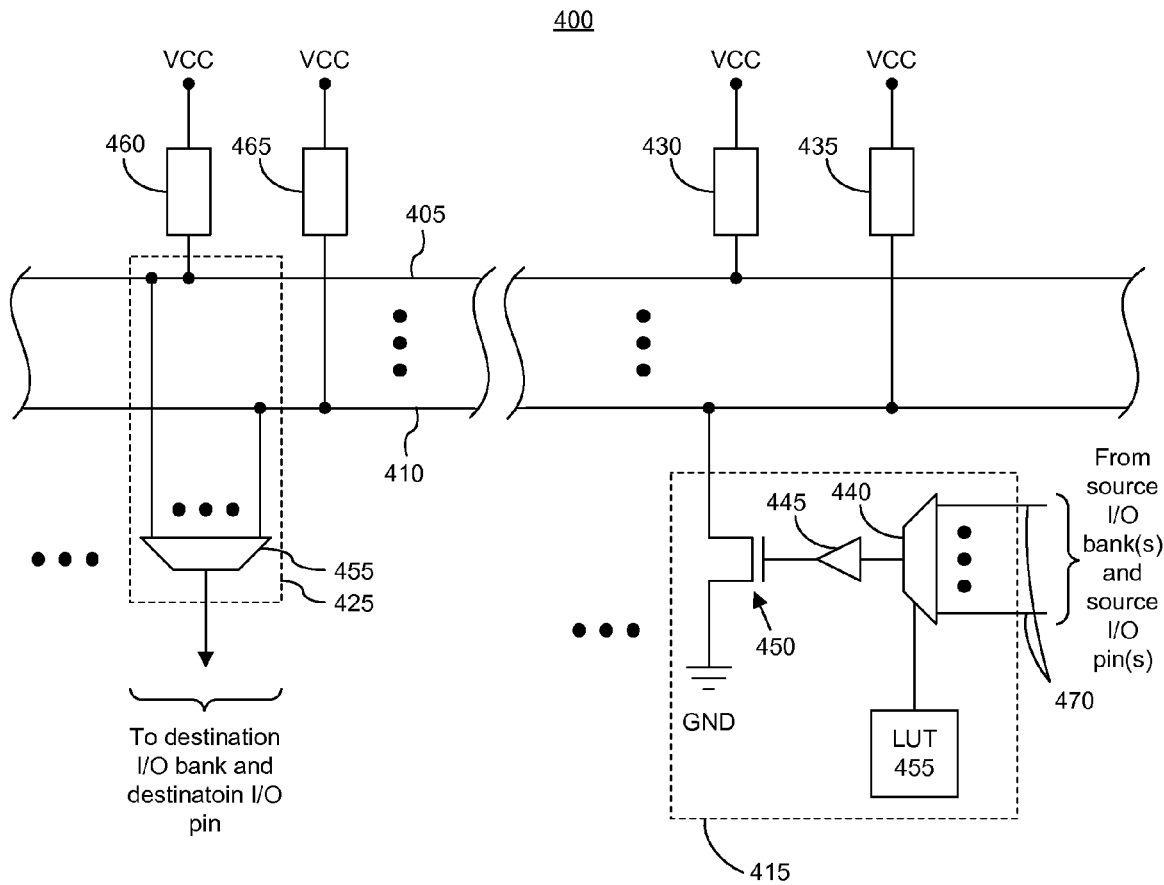
FIG. 4 is a circuit diagram illustrating a bypass routing bus in accordance with another embodiment of the present invention.

FIG. 4 is a block diagram illustrating a bypass routing bus 400 in accordance with another embodiment of the present invention. The bypass routing bus 400 can include one or more bypass routes 405 and 410. It should be appreciated that while only two bypass routes are illustrated in FIG. 4, more or fewer bypass routes may be included within the bypass routing bus 400 as may be desired. The number of bypass routes may be limited only by the availability of area on the host FPGA or the availability of circuit resources.

Each of the bypass routes 405 and 410 can include one or more drivers (not shown). In addition, each bypass route 405 and 410 can be coupled to a plurality of pull-up devices 430, 435, 460, and 465. For example, bypass route 405 can be coupled to a source pull-up device 430 and a destination pull-up device 460. Bypass route 410 can be coupled to a source pull-up device 435 and a destination pull-up device 465. The pull-up devices 430, 435, 460, and 465 can keep the bypass routes at a high voltage while the PLD is in low power mode. The pull-up devices 430, 435, 460, and/or 465 can maintain each bypass route 405 and 410 at a specified VCC level per each IOB. It should be appreciated that in some cases, however, the VCC level of the source and destination may be different, e.g., a source IOB having a VCC level of 3.3 volts and the destination IOB having a VCC level of 1.8 volts.

In one embodiment, a pull-up device can be included for each IOB of the FPGA, or at least each IOB that is permitted to be coupled to a bypass route. For example, if the FPGA includes "n" IOBs, the FPGA can include at least "n" pull-up devices for each bypass route. In another embodiment, it may be the case that only selected IOBs may include the circuitry needed to couple to the bypass routing bus 400. In any case, each pull-up device 430, 435, 460, and 465 can be coupled a power source, e.g., VCC. In any case, when in both normal power mode and low power mode, only one pull-up device will be active, for a given bypass route, to pull up that bypass route to a specified voltage level. Assuming four I/O banks, this means, for example, only one pull-up device should be programmed to be active in normal power mode. Similarly, while in low power mode, only one pull-up device should be programmed to be active.

As noted, each pull-up device can be associated with, or correspond to, an IOB. Accordingly, each IOB and associated pull-up device can be driven by the same power source. That is, when power is supplied to an IOB, power also can be supplied to the associated pull-up device. When no power is supplied to an IOB, no power will be supplied to the corresponding pull-up device. The pull-up devices 430, 435, 460, and 465 further can be configured as "open-drain" type devices. As pull-up devices are known in the art, any of a variety of pull-up devices may be used including "open-drain" type pull-up devices as noted.

The bypass routing bus 400 can include one or more source bypass signal generators 415. In general, the output of each source bypass signal generator 415 can be coupled to a bypass route. For example, source bypass signal generator 415 is coupled to bypass route 410. Further source bypass signal generators can be included for each bypass route of the bypass routing bus 400. Thus, another source bypass signal generator can be included that couples to bypass route 405. Any signal generated and propagated on a bypass route can be generated by the source bypass signal generator coupled to that bypass route.

The source bypass signal generator 415 can include a multiplexer 440, a driver 445, and a transistor 450. A LUT 455 may optionally be included within the bypass signal generator 415 to provide further programmability and flexibility. One or more I/O signals 470 can be provided as input to the source bypass signal generator, e.g., the input of multiplexer 440. Each I/O signal can be taken from, for example, a source I/O pin (or source IOB) within a source I/O bank. By coupling multiple I/O signals to each source bypass signal generator 415, the generation of a bypass signal on a particular bypass route can be controlled by one or more I/O signals, e.g., any predetermined combination of I/O signals provided to the source bypass signal generator 415.

The LUT 455 can receive one or more control signals (not shown) as input. Responsive to particular conditions defined according to the signals input to the LUT 455, the LUT 455 can output a control signal to the multiplexer 440. Inclusion of the LUT 455 facilitates greater programmability in that multiple control signals can be used in controlling multiplexer 440. In one embodiment, a power down indication signal can be provided to the LUT 455, which can cause a particular value to be output and provided to multiplexer 440. It should be appreciated that a less complex version of the source bypass signal generator 415 can be implemented in which a control signal is coupled directly to the multiplexer 420, e.g., without the intervening LUT 455.

When a predetermined combination of one or more I/O signals and an appropriate control signal from LUT 455 are received by multiplexer 440, multiplexer 440 can output a high signal. Responsive to the high signal output from multiplexer 440, the driver 445 can drive the gate of transistor 450 sufficiently so that transistor 450 turns on, creating a path to ground via the drain of transistor 450. As shown, the output of source bypass signal generator 415, e.g., the source of transistor 450, is coupled to bypass route 410. This condition, in conjunction with the pull-up devices 435 and 465, brings the voltage of bypass route 410 low, thereby creating a bypass signal on bypass route 410.

In one embodiment (not shown), each bypass route can be coupled directly to a selected destination I/O pin. For example, such a connection can be made through a switch that establishes the connection in response to the logic core of the host FPGA entering power down mode.

In another embodiment, as pictured in FIG. 4, the bypass routing bus 400 also can include one or more destination bypass signal generators 425. The destination bypass signal generator 425 can include a multiplexer 455. One or more control signals (not show) can be provided to multiplexer 445. For example, a LUT can be used to output control signals as discussed with reference to source bypass signal generator 415.

The input of the destination bypass signal generator 425, e.g., the input to multiplexer 455, can be coupled to one or more of the bypass routes 405 and 410. When a plurality of bypass routes are coupled to multiplexer 455, an output bypass signal from the output of the destination bypass signal generator 425, e.g., the output of multiplexer 455, can be selectively output to a particular destination I/O bank and destination I/O pin depending upon the particular bypass routes upon which bypass signals are detected and any received control signals. It should be appreciated that further bypass signal generators can be included with each being configured to selectively generate an output bypass signal to a particular destination I/O pin based upon a particular combination of detected bypass signals. This allows a bypass signal to be generated on any of a variety of destination I/O pins of a destination I/O bank.

In operation, when the logic core of an FPGA is on, e.g., in normal operating mode, the bypass routes 405 and 410 can be at a high level, e.g., approximately at VCC. For example, consider the case of bypass route 410 having a source IOB and corresponding pull-up device 435 and a destination IOB being associated with pull-up device 465. When the core logic is on, pull-up device 465 can be placed in an active state. Using a PMOS configuration, for example, the pull-up device can be powered by VCC and receive a control signal of approximately zero voltage to the gate of the PMOS device included therein.

The other pull-up devices on bypass route 410, whether associated with other IOBs or the source IOB, e.g., pull-up device 435, can be placed in an inactive state. A control signal of approximately VCC can be provided to the gate of each other pull-up device. As each pull-up device is powered by VCC, each such pull-up device receiving VCC at its gate will be inactive. Accordingly, the node at which pull-up device 465 connects with bypass route 410 will be pulled up to a voltage of approximately VCC.

When the logic core is turned off, e.g., in low power mode, the voltage supplied to each pull-up device coupled to bypass route 410, with the exception of pull-up devices 435 and 465, will go to zero. That is, power can be maintained to the source and destination IOBs and corresponding pull-up devices, while power to each non-source or non-destination IOB and corresponding pull-up device goes to zero. The signal applied to each PMOS transistor gate of each non-source and non-destination pull-up device will also go to zero, leaving such pull-up devices inactive. Pull-up device 465 will remain active and continue to be powered by VCC at the source and a control signal of zero at its gate. Pull-up device 435 can continue to be powered by VCC and receive a control signal having a voltage of approximately VCC at its gate. Accordingly, pull-up device 435 can remain inactive. The voltage of bypass route 410 can remain high until such time that transistor 450 becomes active to sink current. At that point, bypass route 410 can be pulled low.

In another example, assume that the PLD is placed in low power mode and that the source IOB and the destination IOB are powered with different VCC levels. The VCC level of the source IOB and pull-up device can be 3.3. volts, while the VCC level of the destination IOB and pull-up device can be 1.8 volts. In order to remove any voltage conflict from pull-up devices, the pull-up device of the destination IOB can be active. That is, the gate voltage of the destination IOB pull-up device should be at ground level. The pull-up device of the source IOB should be inactive, e.g., have a gate voltage of approximately VCC. Accordingly, the source side pull-up device drives the bypass route with an open drain circuit.

In another embodiment, rather than having a source I/O bank and a different destination I/O bank, one I/O bank can be configured to include one or more source I/O pins and one or more destination I/O pins. As such, selected source I/O pins within the selected I/O bank can be coupled to a source bypass signal generator. Selected destination I/O pins within the same selected I/O bank can be coupled to a destination bypass signal generator.

Figure 5:
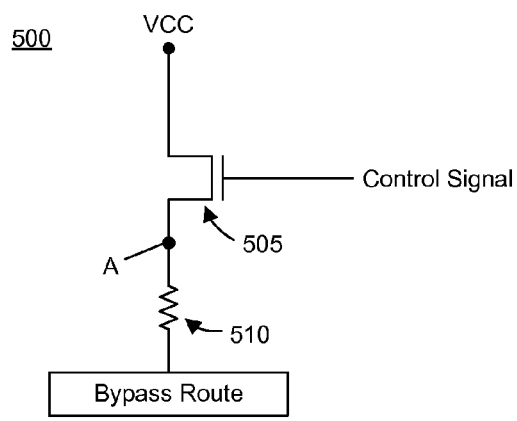
FIG. 5 is a circuit diagram illustrating a pull-up device in accordance with another embodiment of the present invention.

FIG. 5 is a circuit diagram illustrating a pull-up device 500 in accordance with another embodiment of the present invention. As shown, the pull-up device 500 can include a transistor 505 coupled to a voltage source VCC via its source. The transistor 505 can be a PMOS type transistor. The gate of transistor 505 can be coupled to a control signal which can vary between a voltage of VCC and zero. The transistor 505 further is coupled to a resistive element 510 at node A, e.g., the drain, with the opposing end or node of resistive element 510 being coupled to a bypass route. When active, transistor 505 will have a resistance that can be characterized as $R_{ON}$. The resistance of resistive element 510, denoted as R, can be approximately 20 times that of $R_{ON}$. That is, the ratio of resistance of R:$R_{ON}$ can be 20:1. This ratio can achieve an off condition in inactive IOBs of the FPGA.

FIG. 6 is a flow chart illustrating a method 600 of routing signals within an FPGA in accordance with another embodiment of the present invention. The method 600 can be implemented within an FPGA including a bypass routing bus as described herein. The method 600 illustrates an exemplary process in which source bypass signal generators selectively generate bypass signals upon bypass routes in the FPGA. The method 600 can begin in step 605 where one or more selected portions of the FPGA can be placed into low power mode. For example, the logic core of the FPGA and one or more I/O banks can be placed in low power mode. Accordingly, selected I/O signals, e.g., received via source I/O pins of a source I/O bank, can be coupled to the source bypass signal generators.

In step 610, power can be maintained to one or more non-selected portions of the FPGA. For example, power can be maintained to a source I/O bank and a destination I/O bank. Power further can be maintained to the bypass routing bus. In step 615, a determination can be made as to whether the selected portions of the FPGA, e.g., the logic core, remain in the low power mode. If so, the method can proceed to step 620. If not, the method can end as there is no need to generate a bypass signal as the FPGA will resume normal operation and be able to pass signals and process signals through the logic core in a conventional manner.

In step 620, selected I/O signals received in the source I/O bank can be monitored. One or more source bypass signal generators can monitor selected I/O signals to determine whether a particular combination of I/O signals has been detected. While one or more bypass signal generators can monitor for the same combination of I/O signals, it should be appreciated that each of the source bypass signal generators can operate independently and, therefore, detect the occurrence of a different combination of I/O signals.

In step 625, a determination can be made as to whether one (or more) of the source bypass signal generators has detected a predetermined combination of I/O signals. If so, the method can proceed to step 630. If not, the method can loop back to step 615 and continue monitoring for the predetermined combination of I/O signals or the discontinuation of low power mode in the FPGA.

Continuing with step 630, responsive to detecting a predetermined combination of I/O signals within one or more source bypass signal generators, such source bypass signal generators can generate a bypass signal on a bypass route. As noted, each source bypass signal generator can be coupled to a bypass route. Accordingly, each source bypass signal generator that detects the predetermined combination of I/O signals for that source bypass signal generator can responsively generate a bypass signal on the bypass route coupled to that source bypass signal generator.

FIG. 7 is a flow chart illustrating a method 700 of routing signals within an FPGA in accordance with another embodiment of the present invention. The method 700 can be implemented within an FPGA including a bypass routing bus as described herein. The method 700 illustrates an exemplary process in which destination bypass signal generators detect bypass signals on bypass routes and selectively generate, or output, an output bypass signal. Accordingly, it should be appreciated that the method 700 can be performed concurrently with the method described with reference to FIG. 6.

The method 700 can begin in step 705 where a determination can be made as to whether the FPGA is still in low power mode. If so, the method can continue to step 710. If not, the method can end as no bypass signals will be generated. In step 710, each destination bypass signal generator can monitor for bypass signals upon the bypass routes to which that destination bypass signal generator is coupled. As noted, each destination bypass signal generator can be coupled to one, or more, bypass routes.

In step 715, a determination can be made by each destination bypass signal generator as to whether a predetermined combination of bypass signals has been detected. While one or more or all of the destination bypass signal generators may monitor for the same combination of bypass signals, it should be appreciated that each can function independently, and thus, monitor and detect a different combination of bypass signals and, accordingly, bypass routes.

If a predetermined combination of bypass signals is determined within one or more of the destination bypass signal generators, the method can proceed to step 720. If not, the method can loop back to step 705 and continue monitoring for further bypass signals and/or the termination of low power mode.

Continuing with step 720, each destination bypass signal generator that detects the predetermined bypass signal combination for that destination bypass signal generator can generate, or output, an output bypass signal. Each destination bypass signal generator can be coupled to a particular destination I/O pin within a destination I/O bank. Accordingly, the output bypass signal from a particular destination bypass signal generator can be output to the destination I/O pin, and destination I/O bank, coupled to that destination bypass signal generator.

The flowcharts in the figures illustrate the architecture, functionality, and operation of possible implementations of systems and methods according to various embodiments of the present invention. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A programmable integrated circuit, comprising:
   a logic core;
   a source input/output (I/O) bank comprising at least one source I/O pin, wherein the source I/O bank operates in normal operating mode and the source I/O pin is coupled to the logic core;
   a destination I/O bank comprising at least one destination I/O pin, wherein the destination I/O bank operates in normal operating mode and the destination I/O pin is coupled to the logic core; and
   a bypass routing bus that selectively couples to the source I/O bank and the destination I/O bank and bypasses the logic core;
   wherein the bypass routing bus comprises a plurality of bypass routes and a plurality of destination bypass signal generators, wherein each of the plurality of bypass routes is coupled to an input of at least one destination bypass signal generator, and
   wherein, responsive to the logic core entering low power mode and becoming inactive, the source I/O pin and the destination I/O pin are disconnected from the logic core and are coupled to the bypass routing bus, and wherein the bypass routing bus detects an I/O signal from the source I/O pin, responsively generates a bypass signal that is provided to the destination I/O bank and, responsive to the bypass signal, generates an output bypass signal on the destination I/O pin.

2. The programmable integrated circuit of claim 1, wherein the bypass routing bus further comprises at least one bypass route that circumnavigates the logic core and couples the source I/O bank with the destination I/O bank.

3. The programmable integrated circuit of claim 1, wherein the bypass routing bus further comprises a bypass route that is external to the logic core.

4. The programmable integrated circuit of claim 1, wherein the bypass routing bus is selectively coupled to the source I/O pin and the destination I/O pin.

5. The programmable integrated circuit of claim 1, wherein the bypass routing bus further comprises:
   a plurality of bypass routes; and
   a plurality of source bypass signal generators, wherein an output of each source bypass signal generator is coupled to one bypass route.

6. The programmable integrated circuit of claim 5, wherein each source bypass signal generator receives at least one I/O signal from the source I/O pin of the source I/O bank.

7. The programmable integrated circuit of claim 1, wherein an output of each destination bypass signal generator is coupled to a destination I/O pin in the destination I/O bank, wherein each destination bypass signal generator selectively generates an output bypass signal through the destination I/O pin coupled to that destination bypass signal generator.

8. The programmable integrated circuit of claim 7, wherein each destination bypass signal generator generates the output bypass signal according to the bypass routes upon which bypass signals are detected.

9. The programmable integrated circuit of claim 1, wherein, responsive to the logic core entering low power mode and becoming inactive, at least one other I/O bank of the programmable integrated circuit enters low power mode and is deactivated and remains deactivated while the logic core remains in low power mode.

10. The programmable integrated circuit of claim 1, wherein the bypass routing bus further comprises:
   a plurality of source bypass signal generators, wherein each source bypass signal generator selectively generates a bypass signal according to at least one I/O signal received from the source I/O pin of the source I/O bank;

wherein the plurality of bypass routes circumnavigate the logic core, where each bypass route is coupled to an output of one source bypass signal generator; and wherein each destination bypass signal generator selectively generates an output bypass signal according to bypass signals detected upon bypass routes coupled to the destination bypass signal generator.

11. The programmable integrated circuit of claim 1, wherein, responsive to the logic core entering low power mode and becoming inactive, selected I/O pins within the source I/O bank and the destination I/O bank are disabled while the logic core remains in low power mode.

12. A programmable integrated circuit, comprising:

a logic core;

a source input/output (I/O) bank comprising at least one source I/O pin, wherein the source I/O bank operates in normal operating mode and the source I/O pin is coupled to the logic core;

a destination I/O bank comprising at least one destination I/O pin, wherein the destination I/O bank operates in normal operating mode and the destination I/O pin is coupled to the logic core;

a bypass routing bus that selectively couples to the source I/O bank and the destination I/O bank and bypasses the logic core, wherein, responsive to the logic core entering low power mode and becoming inactive, the source I/O pin and the destination I/O pin are disconnected from the logic core and are coupled to the bypass routing bus, and wherein the bypass routing bus detects an I/O signal from the source I/O pin, responsively generates a bypass signal that is provided to the destination I/O bank and, responsive to the bypass signal, generates an output bypass signal on the destination I/O pin, wherein, responsive to the logic core entering low power mode and becoming inactive, at least one other I/O bank of the programmable integrated circuit enters low power mode and is deactivated and remains deactivated while the logic core remains in low power mode.

13. A programmable integrated circuit, comprising:

a logic core;

a source input/output (I/O) bank comprising at least one source I/O pin, wherein the source I/O bank operates in normal operating mode and the source I/O pin is coupled to the logic core;

a destination I/O bank comprising at least one destination I/O pin, wherein the destination I/O bank operates in normal operating mode and the destination I/O pin is coupled to the logic core;

a bypass routing bus that selectively couples to the source I/O bank and the destination I/O bank and bypasses the logic core, wherein, responsive to the logic core entering low power mode and becoming inactive, the source I/O pin and the destination I/O pin are disconnected from the logic core and are coupled to the bypass routing bus, and wherein the bypass routing bus detects an I/O signal from the source I/O pin, responsively generates a bypass signal that is provided to the destination I/O bank and, responsive to the bypass signal, generates an output bypass signal on the destination I/O pin, wherein, responsive to the logic core entering low power mode and becoming inactive, selected I/O pins within the source I/O bank and the destination I/O bank are disabled while the logic core remains in low power mode.

* * * * *